United States Patent
Yu et al.

(10) Patent No.: US 6,646,307 B1
(45) Date of Patent: Nov. 11, 2003

(54) MOSFET HAVING A DOUBLE GATE

(75) Inventors: Bin Yu, Cupertino, CA (US); Eric N. Paton, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/081,362

(22) Filed: Feb. 21, 2002

(51) Int. Cl.[7] .................. H01L 27/01; H01L 27/12; H01L 31/0392
(52) U.S. Cl. .................. 257/347; 257/366; 257/368
(58) Field of Search .................. 257/66, 347, 365, 257/366, 351, 368, 67, 348, 350, 352, 353; 438/149, 157, 176, 277, 283, 479, 517

(56) References Cited

U.S. PATENT DOCUMENTS

| | | | |
|---|---|---|---|
| 5,604,368 A | * 2/1997 | Taur et al. | 257/348 |
| 5,689,127 A | 11/1997 | Chu et al. | 257/329 |
| 5,773,331 A | 6/1998 | Solomon et al. | 438/164 |
| 5,780,327 A | 7/1998 | Chu et al. | 438/156 |
| 6,013,553 A | 1/2000 | Wallace et al. | 438/287 |
| 6,020,024 A | 2/2000 | Maiti et al. | 438/287 |
| 6,166,412 A | 12/2000 | Kim et al. | 257/366 |
| 6,335,214 B1 | * 1/2002 | Fung | 438/30 |
| 6,403,981 B1 | * 6/2002 | Yu | 257/63 |
| 6,514,826 B1 | * 2/2003 | Park et al. | 438/287 |

FOREIGN PATENT DOCUMENTS

JP 408321617 A * 12/1996

* cited by examiner

Primary Examiner—Long Pham
Assistant Examiner—Hoai Pham
(74) Attorney, Agent, or Firm—Renner, Otto, Boisselle & Sklar, LLP

(57) ABSTRACT

A double gate MOSFET. The MOSFET includes a bottom gate electrode and a bottom gate dielectric disposed over the bottom gate electrode. A semiconductor body region is disposed over the bottom gate dielectric and the bottom gate electrode, and disposed between a source and a drain. A top gate electrode is disposed over the body. A top gate dielectric separates the top gate electrode and the body, the top gate electrode and the bottom gate electrode defining a channel within the body and interposed between the source and the drain. At least one of the bottom gate dielectric or the top gate dielectric is formed from a high-K material. A method of forming a double gate MOSFET is also disclosed where a semiconductor film used to form a body is recrystallized using a semiconductor substrate as a seed crystal.

18 Claims, 3 Drawing Sheets

MOSFET HAVING A DOUBLE GATE

TECHNICAL FIELD

The present invention relates generally to semiconductor devices and the fabrication thereof and, more particularly, to a MOSFET having a double gate and a method of formation.

BACKGROUND

A pervasive trend in modern integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. For example, certain materials, when used in a down-scaled device, may become electrically leaky and can cause reliability problems.

Another trend in modern integrated circuit manufacture is to produce high performance semiconductor devices with low threshold voltages, low power consumption and increased switching speed. For example, SOI devices have been shown to have enhanced device performance over bulk devices due to a variety of desirable characteristics. However, an increase in performance beyond that currently attainable in SOI devices is desirable.

Accordingly, there exists a need in the art for semiconductor devices, such as MOSFETs, that optimize scale and performance. There also exists a need for corresponding fabrication techniques to make those semiconductor devices.

SUMMARY OF THE INVENTION

According to one aspect of the invention, a double gate MOSFET is provided. The MOSFET includes a bottom gate having a bottom gate electrode and a bottom gate dielectric formed from a high-K material disposed over the bottom gate electrode. The MOSFET also includes a semiconductor body region disposed over the bottom gate dielectric and the bottom gate electrode, and disposed between a source and a drain. A top gate including a top gate electrode is disposed over the body. A top gate dielectric separates the top gate electrode and the body, the top gate electrode and the bottom gate electrode defining a channel within the body and interposed between the source and the drain.

According to another aspect of the invention, a double gate MOSFET is provided. The MOSFET includes a bottom gate including a bottom gate electrode and a bottom gate dielectric disposed over the bottom gate electrode. The MOSFET also includes a semiconductor body region disposed over the bottom gate dielectric and the bottom gate electrode, and disposed between a source and a drain. A top gate including a top gate electrode is disposed over the body. A top gate dielectric formed from a high-K material separates the top gate electrode and the body, the top gate electrode and the bottom gate electrode defining a channel within the body and interposed between the source and the drain.

According to yet another aspect of the invention, a method of forming a double gate MOSFET. The method includes providing wafer, the wafer including a semiconductor substrate having an insulating layer disposed over the semiconductor substrate; forming a bottom gate electrode over the insulating layer; forming a bottom gate dielectric over the bottom gate electrode; forming a seeding window in at least the insulating layer to expose a portion of the semiconductor substrate; forming a semiconductor body region over the bottom gate electrode and separated from the bottom gate electrode by the bottom gate dielectric; and forming a top gate having a top gate electrode over the body region, the top gate electrode and the body region separated by a top gate dielectric. The step of forming the semiconductor body region includes forming an amorphous semiconductor film on the wafer and over the bottom gate dielectric and recrystallizing the amorphous semiconductor film using the semiconductor substrate as a seed crystal.

BRIEF DESCRIPTION OF DRAWINGS

These and further features of the present invention will be apparent with reference to the following description and drawings, wherein.

DISCLOSURE OF INVENTION

Figure 1:
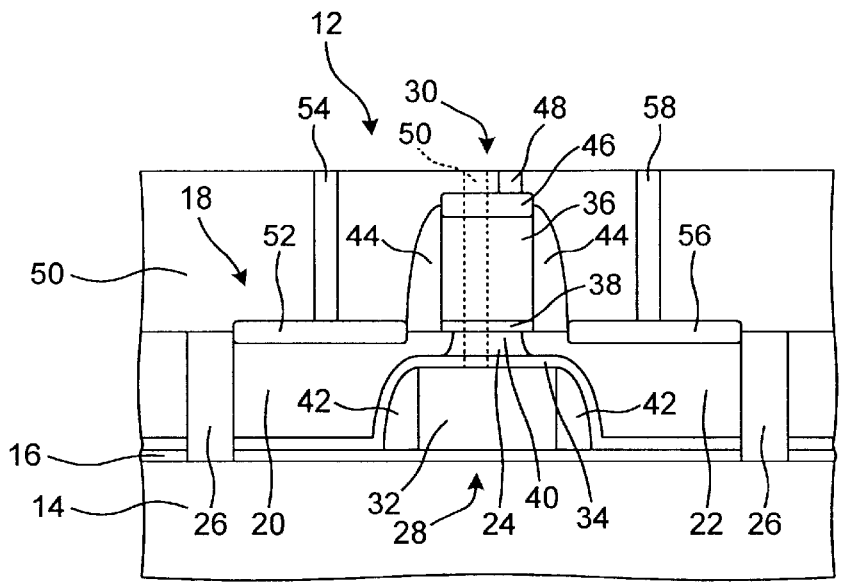
FIG. 1 is a schematic block diagram of a double gate MOSFET formed in accordance with the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a wafer 10 having a double gate metal oxide semiconductor field effect transistor (MOSFET) 12 formed in accordance with an example embodiment of the present invention is illustrated. The illustrated MOSFET 12 can be used, for example, in the construction of a complimentary metal oxide semiconductor (CMOS) integrated circuit. Although only one MOSFET 12 is illustrated, one skilled in the art will appreciate that the illustrated device is merely exemplary and that multiple MOSFETs 12, including N-channel and/or P-channel devices, can be formed on the wafer 10.

The wafer 10 includes a layer of semiconductor material 14 (also referred to herein as a supporting substrate or a semiconductor substrate) on which the MOSFET 12 is formed. In one embodiment, the layer of semiconductor material 14 is a bulk silicon substrate. Disposed on the layer of semiconductor material 14 is a isolating layer 16 made from a dielectric material such as, for example, silicon oxide. The isolating layer 16 serves as an isolation layer (sometimes referred to as a buried oxide (BOX) layer) for isolating an active region 18 of the MOSFET 12 from the layer of semiconductor material 14. As will be described in greater detail below, the active region 18 is formed, at least in part, from a semiconductor material. As a result, the MOSFET 12 can be considered to be fabricated in semiconductor-on-insulator (SOI) format.

The active region 18 of the MOSFET 12 includes a source 20, a drain 22 and a body 24 disposed between the source 20 and the drain 22. The source 20 and the drain 22 can each include an extension region and a deep doped region as will be described in greater detail below. The active region 18 can be isolated from adjacent semiconductor devices formed on the wafer 14 by isolation regions 26, such as shallow trench isolation (STI) regions. The size and placement of the active region 18 is defined, in part, by the isolation regions 26.

A first, or bottom, gate 28 is disposed under the body region 24. A second, or top, gate 30 is disposed above the body region 24. The bottom gate 28 includes a bottom gate electrode 32 separated from the body region by a bottom gate dielectric 34. Similarly, the top gate 30 includes a top gate electrode 36 separated from the body region by a top gate dielectric 38. The bottom gate 28 and the top gate 30 cooperate to define a channel 40 within the body 24 (the channel 40 being interposed between the source 20 and the drain 22 and controlled by respective work functions of the top gate 30 and the bottom gate 28).

In one embodiment, the bottom gate electrode 32 is made from a semiconductor material (e.g., polycrystalline silicon, polycrystalline silicon-germanium, etc.) that is doped with an appropriate dopant. In an alternative embodiment, the bottom gate electrode 32 could be made form a metal or metal containing compound such as, for example, tungsten, tantalum, aluminum, nickel, ruthenium, rhodium, palladium, platinum, titanium, molybdenum, titanium-nitride, tantalum nitride, or the like. Similarly, top gate electrode 36 can be made from a semiconductor material (e.g., polycrystalline silicon, polycrystalline silicon-germanium, etc.) that is doped with an appropriate dopant. In alternative an embodiment, the top gate electrode 36 could be made form a metal or metal containing compound such as, for example, tungsten, tantalum, aluminum, nickel, ruthenium, rhodium, palladium, platinum, titanium, molybdenum, titanium-nitride, tantalum nitride, or the like.

In one embodiment, the bottom gate dielectric 34 is made from a high-K material or stack of materials to form a high-K dielectric stack. As used herein, a "high-K material" or a "high-K dielectric material" refers to a material, or stack of materials, having a relative permittivity in one embodiment of about ten (10) or more, and in another embodiment of about twenty (20) or more. Relative permittivity is the ratio of the absolute permittivity ($\in$) found by measuring capacitance of the material to the permittivity of free space ($\in_o$), that is $K=\in/\in_o$. High-K materials will be described in greater detail below. Although other materials can be selected for the gate dielectric 38 of the NMOS device 12, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST) are example suitable materials for the gate dielectric 38 of the NMOS device 12. In addition, all binary and ternary metal oxides and ferroelectric materials having a K higher than, in one embodiment, about twenty (20) can be used for the gate dielectric 34.

As used herein, the term "standard-K dielectric material" or "standard-K dielectric material" refers to a dielectric material having a relative permittivity, or K, of up to about ten (10). Example standard-K materials include, for example, silicon dioxide (K of about 3.9), silicon oxynitride (K of about 4 to 8 depending on the relative content of oxygen and nitrogen) and silicon nitride (K of about 6 to 9).

When a high-K material is selected as the bottom gate dielectric 34, the high-K material can have an equivalent oxide thickness (EOT) of about one nanometer (1 nm) or less. A relatively small EOT is often desirable to enhance switching speed, especially in N-channel devices where N-channel device speed is closely related to overall CMOS circuit performance. A gate dielectric made from a high-K material may also be desirable to minimize performance degrading effects, such as leakage, that may occur when the thickness of a standard-K dielectric material becomes thin (e.g., approaching about 10 Å). A high-K dielectric allows for the establishment of a suitable capacitance with a physically thicker dielectric layer. For example, a nitride gate dielectric having a K of about 7.8 and a thickness of about 100 Å is substantially electrically equivalent to an oxide gate dielectric having a K of about 3.9 and a thickness of about 50 Å. In addition, devices fabricated with a high-K dielectric layer tend to have improved reliability.

A buffer interface (not illustrated) can optionally be formed between the bottom gate electrode 32 and the bottom gate dielectric 34. The buffer interface can be, for example, an oxide layer having a thickness of about 0.5 nm to about 0.7 nm. The buffer interface may act to retard reaction of the high-K material with semiconductor material contained within the bottom gate electrode. Therefore, if the bottom gate electrode is made from a metal or a metal containing compound, the buffer interface formed between the bottom gate electrode 32 and the bottom gate dielectric 34 can be omitted.

A second buffer interface (not illustrated) can optionally be formed between the bottom gate dielectric 34 and the active region 18, including the body region 24 and, if desired, the source 20 and the drain 22. The second buffer interface can be, for example, an oxide layer having a thickness of about 0.5 nm to about 0.7 nm. The second buffer interface may act to retard reaction of the high-K material with semiconductor material contained within the active region 18. The second buffer interface may also act to reduce diffusion and/or penetration of atoms from the bottom gate dielectric 34 into the active region 18, and particularly the body region 24, that could lead to a degradation in channel 40 mobility.

In one embodiment, the top gate dielectric 38 is made from a high-K material or stack of materials to form a high-K dielectric stack. When a high-K material is selected as the top gate dielectric 38, the high-K material can have an EOT of about one nanometer (1 nm) or less. Alternatively, the top gate dielectric 38 can be made from a standard-K dielectric material. If the top gate dielectric 38 is made from a high-K material, a third buffer interface (not illustrated) can optionally be formed between the top gate dielectric 38 and the active region 18 for the reasons described above with respect to the second buffer interface. Optionally, another buffer interface could be formed between the top gate dielectric 38 and the top gate electrode 36.

In one embodiment, the MOSFET 12 can be formed as a "symmetrical gate" device where the top gate 30 (including the top gate electrode 36 and the top gate dielectric 38) is formed from the same materials with substantially the same thicknesses as those used for the bottom gate 28 (including the bottom gate electrode 32 and the bottom gate dielectric 34). Alternatively, the top gate 30 materials can be selected to be substantially electrically equivalent to the bottom gate 28 materials.

The bottom gate electrode 32 can be provided with sidewall spacers 42. The sidewall spacers 42 assist in defining the configuration of the source 20, the drain 22 and the body 24 by controlling the formation of semiconductor material for the active region 18. The top gate 30 can also be provided with sidewall spacers 44. The sidewall spacers 44 of the top gate 30 are used for the reasons conventional sidewall spacers are employed, including acting as a self-aligned mask during ion implantation for the deep doped regions as will be described in greater detail below.

It is noted that the bottom gate dielectric 34 can be a conformal layer formed over an upper surface of the bottom gate electrode 32, the bottom gate sidewall spacers 42 and portions of the isolating layer 16 that extend laterally beyond the bottom gate 28 and/or sidewall spacers 42. In an alternative embodiment, the bottom gate dielectric 34 can be formed or patterned to be disposed over fewer areas, such as only over an upper surface of the bottom gate electrode 32.

The MOSFET 12 can be provided with components to establish electrical connection to the source 20, the drain 22, the top gate electrode 36 and the bottom gate electrode 32. Such components are relatively well known in the art and will not be described in great detail. Briefly, a top gate electrode contact 46 can be formed on an upper surface of the top gate electrode 36. If the top gate electrode 36 is made from a semiconductor material, the top gate electrode contact 46 can be made, for example, from a silicide region formed by reacting a metal (e.g., nickel, cobalt, titanium, molybdenum, etc.) with the semiconductor material of the top gate electrode 36. If the top gate electrode is made from a metal or metal containing compound, then the top gate electrode contact can be omitted or made from another material, such as a metal layer. A via 48 (also known in the art as a contact hole) can transverse a cap layer 50 (also known as a passivation layer) to electrically couple the top gate electrode contact 46 to a conductor line (not shown).

Connection to the bottom gate electrode 32 can be made in much the same way as made for the top gate electrode 36. More specifically, and if appropriate, a bottom gate electrode contact (not shown) can be disposed adjacent the bottom gate electrode 32. Such a contact can be located adjacent an end wall of the bottom gate electrode 32 or on an upper surface of the bottom gate electrode 32 that extends, for example, beyond a width of the top gate electrode 36. A via 50 (denoted by dashed lines) can be used to establish connection to the bottom gate electrode 32 or, if present, the bottom gate electrode contact. In alternative arrangements, electrical connection can be made to the bottom gate electrode by a buried conductor line, a backside contact and/or any other appropriate mechanism.

Similarly, a source contact 52 and a source via 54 can be provided to establish electrical connection to the source 20. A drain contact 56 and a drain via 58 can be provided to establish electrical connection to the drain 22. If appropriate, the source contact 52 and the drain contact 56 can be silicide regions.

The bottom gate 28 and the top gate 30 of the MOSFET 12 can be coupled to appropriate nodes or voltage sources to control operation of the channel 40. For example, the bottom gate 28 and the top gate 30 can be electrically coupled together such that each of the bottom gate 28 and the top gate 30 are set to the same voltage potential. Alternatively, the bottom gate 28 can be biased separately from the top gate 30.

It is noted that the illustrated MOSFET 12 is electrically similar to a fully-depleted SOI device having a single gate. However, the double gate arrangement provides for enhanced control over the channel, including, for example, an ability to bias the MOSFET 12 to lower a threshold voltage of the MOSFET 12.

Figure 2:
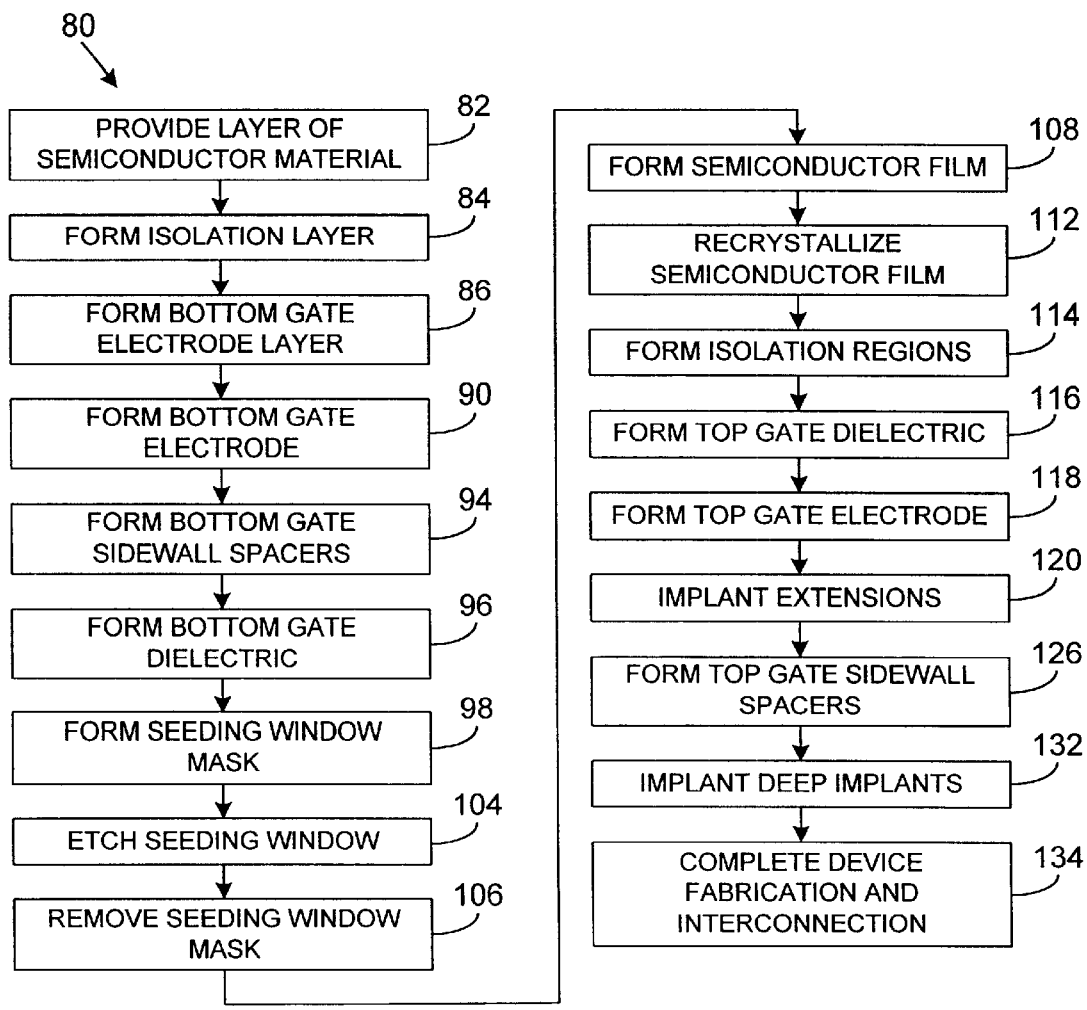
FIG. 2 is a flow chart illustrating a method of forming the double gate MOSFET of FIG. 1.
Figure 3A:
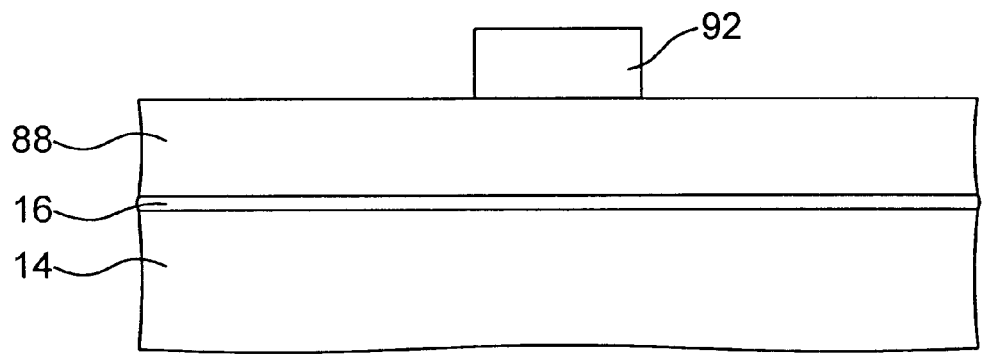
FIGS. 3A through 3F illustrate the double gate MOSFET of FIG. 1 in various stages of manufacture.

Referring now to FIG. 2, an example method 80 for forming the MOSFET 12 illustrated in FIG. 1 will be described. With additional reference to FIG. 3A, the method 80 starts in step 82 where the layer of semiconductor material 14 is provided. As indicated above, the layer of semiconductor material 14 can be a semiconductor substrate (such as a silicon substrate) that is typically used for the formation of bulk-type devices.

Next, in step 84, the isolating layer 16 can be formed on an upper surface of the layer of semiconductor material 14. The isolating layer 16 can be made from a dielectric material (e.g., silicon oxide) that is formed by an appropriate technique such as, for example, thermal oxidation. The isolating layer 16 can have a thickness of about 20 nm to about 50 nm.

In an alternative embodiment, the layer of semiconductor material 14 can be a semiconductor substrate of an SOI stack (e.g., a semiconductor film formed on a BOX layer that is, in turn, formed on a semiconductor substrate) and the isolating layer 16 can be the BOX layer from the SOI stack. In this embodiment, the upper semiconductor film can be selectively etched to the BOX layer such that the MOSFET 12 can be formed on the BOX layer. Other SOI devices (e.g., traditional SOI FET devices, memory cells, etc.) can then be formed in other regions of wafer 10.

Next, in step 86, a bottom gate electrode material layer 88 is formed on the isolating layer 16. As indicated above, the bottom gate electrode material layer 88 can be made from a semiconductor material (e.g., polycrystalline silicon, poly-crystalline silicon-germanium, etc.) that is doped with an appropriate dopant. Alternatively, the bottom gate electrode material layer 88 can be formed from a metal or metal-containing. Such a metal or metal-containing compound can be selected for the formation of P-channel devices (e.g., tungsten, nickel, ruthenium, rhodium, palladium, platinum, titanium nitride, tantalum nitride, or the like) or for the formation of N-channel devices (e.g., tungsten, tantalum, aluminum, titanium nitride, tantalum nitride, or the like). A mid-gap material (e.g., a metal (such as tungsten) or metal-containing compound (such as titanium nitride) having a work function near the center of the band-gap (about 4.6 eV)) can also be selected for use in forming both P-channel or N-channel devices.

Figure 3B:
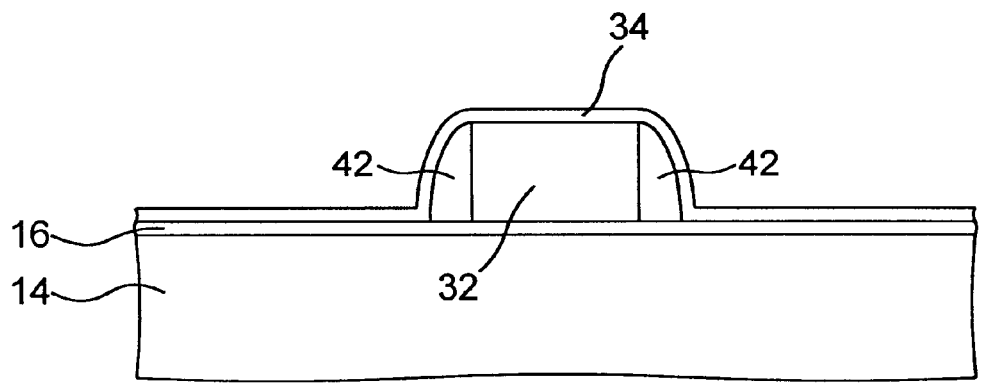

With additional reference to FIG. 3B, the bottom gate electrode 32 is formed from the bottom gate electrode material layer 88 in step 90. When the bottom gate electrode layer 88 is formed from a semiconductor material, step 90 can include implanting ion species to appropriately dope the gate electrode material layer 88. For example, to form a PMOS device, P+ ions such as boron, gallium or indium can be implanted. To form an NMOS device, N+ ions such as antimony, phosphorous or arsenic can be implanted.

Step 90 can also include depositing a layer of photoresist 92 and patterning the layer of photoresist 92 (e.g., by photolithography) to define the size and placement of the bottom gate electrode 32. The bottom gate electrode material layer 88 is then etched to remove undesired portions of the bottom gate electrode material layer 88. The remaining photoresist material 92 can then be removed using conventional techniques.

Thereafter, in step 94, the sidewall spacers 42 are formed. Formation of sidewall spacers is well known in the art and will not be described in great detail. Briefly, the sidewall spacers 42 can be formed from a material such an oxide (e.g., silicon oxide) or, in another embodiment a nitride (e.g., silicon nitride). The sidewall spacers 42 can be formed by depositing the desired material, planarizing the material to have an upper surface that is generally even with an upper surface of the bottom gate electrode 32 and anisotropically etching back the deposited material to an underlying layer (namely, the isolating layer in the illustrated embodiment).

The bottom gate dielectric 34 can then be formed in step 96. For example, a conformal layer of high-K material (or a stack of materials that, in combination, have high-K dielectric properties) can be deposited on top of the upper surface of the bottom gate electrode 32, the sidewall spacers 42, and portions of the isolating layer 16 that extend beyond the bottom gate electrode 32 and the sidewall spacers 42. If desired, the high-K material can be patterned so as to be removed from the portions of the isolating layer 16 that extend beyond the bottom gate electrode 32 or the sidewall spacers 42. In another embodiment, the bottom gate dielectric 34 can be formed from a standard-K material.

As indicated above, step 96 can also include formation of a buffer interface layer before formation of the bottom gate dielectric 34 and/or another buffer interface layer after formation of the bottom gate dielectric 34. These buffer interface layers can be formed from a thin layer of oxide (e.g., a layer of silicon oxide that is about 0.5 nm to about 0.7 nm thick). The buffer interface layer(s) can be formed by a low temperature (about 500° C.) thermal oxidation process, a remote plasma deposition process, an atomic layer deposition (ALD) process or the like. The buffer interface layer(s), if formed, may assist in reducing integration issues that may arise when attempting form a layer of high-K material adjacent a semiconductor layer. Therefore, if the bottom gate dielectric 34 is formed from a standard-K material or if the buffer interface layers are not desired, one or both of the buffer interface layers can be omitted.

Exemplary high-K materials that could be used for the bottom gate dielectric 34 are identified below in Table 1. It is noted that Table 1 is not an exhaustive list of high-K materials and other high-K materials may be available.

TABLE 1

| Dielectric Material | Approximate Relative Permittivity (K) |
| --- | --- |
| aluminum oxide ($Al_2O_3$) | 9–10 |
| zirconium silicate | 12 |
| hafnium silicate | 15 |
| hafnium silicon oxynitride | 16 |
| hafnium silicon nitride | 18 |
| lanthanum oxide ($La_2O_3$) | 20–30 |
| hafnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | ~20—200 |
| barium strontium oxide ($Ba_{1-x}Sr_xO_3$) | ~20—200 |
| $PbTiO_3$ | ~20—200 |
| barium titanate ($BaTiO_3$) | ~20—200 |
| strontium titanate ($SrTiO_3$) | ~20—200 |
| $PbZrO_3$ | ~20—200 |
| PST ($PbSc_xTa_{1-x}O_3$) | 3000 |
| PZN ($PbZn_xNb_{1-x}O_3$) | ~500—5000 |
| PZT ($PbZr_xTi_{1-x}O_3$) | ~150—1000 |
| PMN ($PbMg_xNb_{1-x}O_3$) | ~500—5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Figure 3C:
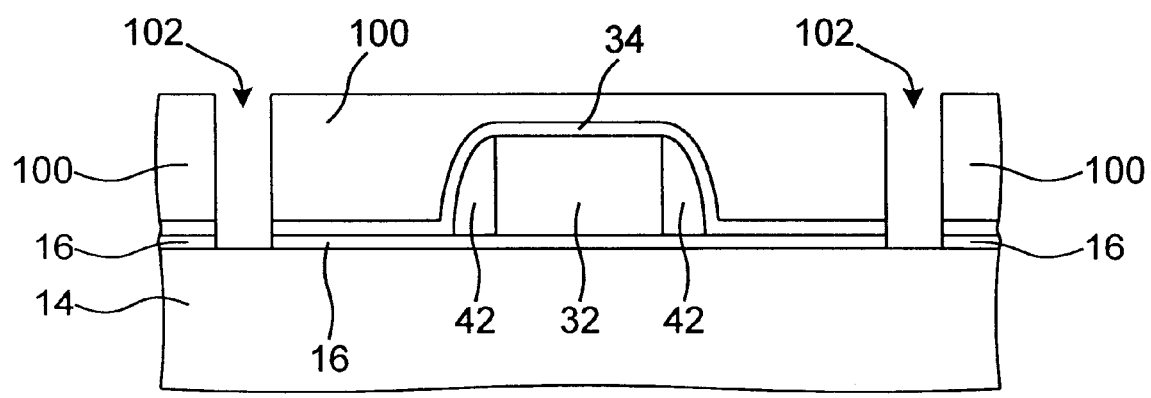

With additional reference to FIG. 3C, the method 80 continues in step 98 where a seeding window mask 100 is formed. Formation of the seeding window mask 100 can include depositing a layer of mask material (e.g., a photoresist) and patterning the mask material with an appropriate technique (e.g., photolithography). The seeding window mask is patterned to expose the bottom gate dielectric 34 in an area (or areas) where a recrystallization window 102 or windows 102 is/are desired. As will be described in greater detail below, the recrystallization windows 102 allow a subsequently deposited semiconductor layer (e.g., amorphous silicon) to be recrystallized using a crystalline structure of the layer of semiconductor material 14 as a seed crystal.

Figure 3D:
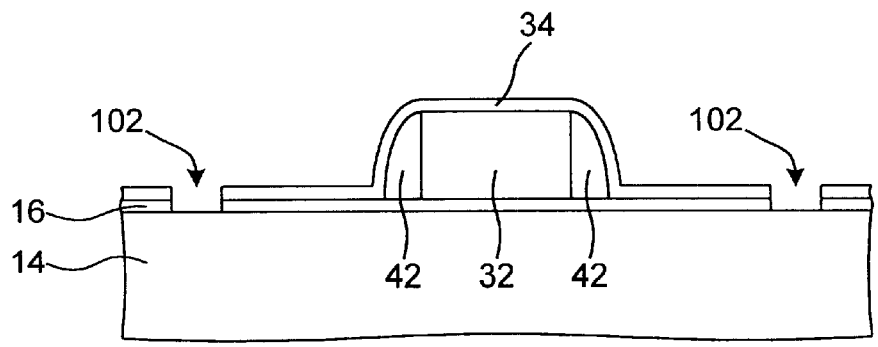

Once the seeding window mask 100 is deposited and patterned, the seeding window(s) 102 can be etched in step 104. More specifically, exposed portions of the bottom gate dielectric 34 and portions of the isolating layer 16 thereunder are etched to expose the layer of semiconductor material 14. Next, in step 106 and as illustrated in FIG. 3D, the seeding window mask 100 (FIG. 3C) is removed.

Figure 3E:
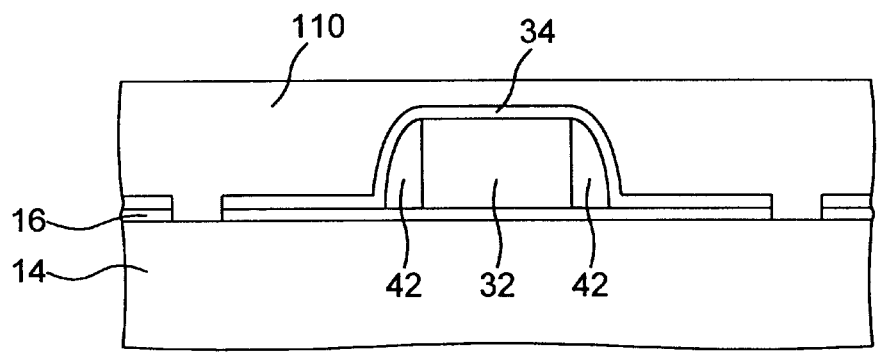

Thereafter, in step 108 and as illustrated in FIG. 3E, a semiconductor film 110 is formed on the wafer 10. In one embodiment, the semiconductor film is composed of amorphous silicon. However, the semiconductor film could alternatively be formed from any other suitable material, including, for example, silicon-germanium. Forming the semiconductor film can include depositing a layer of material using an appropriate technique (such as epitaxy) and polishing the deposited layer using, for example, chemical mechanical planarization (CMP). The semiconductor film 110 can be formed to have a vertical thickness above the bottom gate electrode 32 of about 50 Å to about 300 Å. Therefore, the resulting body region 24 (FIG. 1) formed over the bottom gate electrode 32 will have a corresponding vertical thickness.

Next, in step 112, the semiconductor film 110 is recrystallized to form, for example, crystalline silicon. In one embodiment, the semiconductor film 110 is recrystallized using a low temperature anneal (e.g., at about 550° C. to about 650° C.). During the recrystallization, the layer of semiconductor material 14 serves as a seed crystal for growth of the crystal structure within the semiconductor film 110. If desired, the semiconductor film 110 can be doped with N-type or P-type ions for the formation an N-type body region 24 or a P-type body region 24.

Figure 3F:
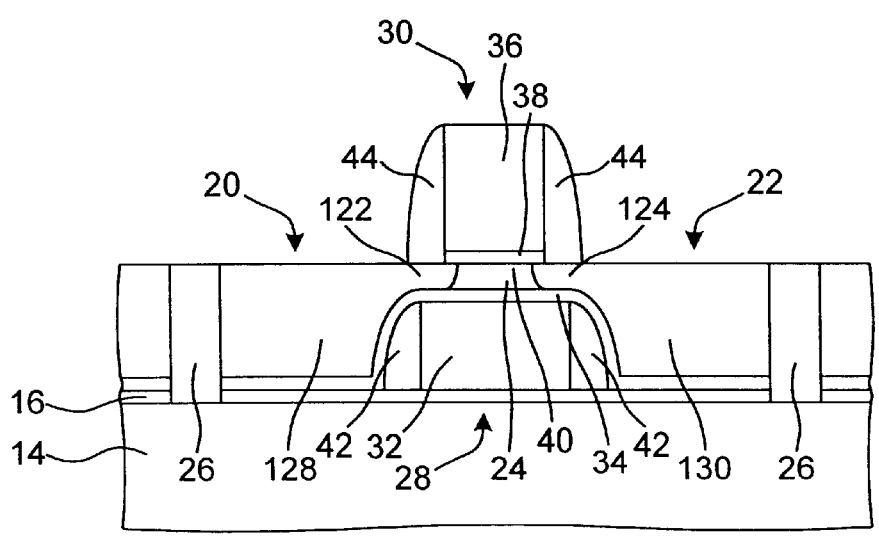

With additional reference to FIG. 3F, the method 80 continues in step 114 where the isolation regions 26 are formed. The formation of isolation regions 26, such as shallow trench isolation (STI) regions, is well known in the art and will not be described in great detail. In one embodiment, the isolation regions 26 are formed in the location of the seeding windows 102 such that the semiconductor layer 110 is isolated from the layer of semiconductor material 14. In the illustrated embodiment, the isolation regions are shown as having approximately the same length as the seeding windows. However, the isolation regions 26 can be formed to have a length that is greater than the length of the seeding windows. Alternatively, the isolation regions can be formed in other locations.

Thereafter, the top gate dielectric 38 can be formed in step 116. Formation of the top gate dielectric 38 can include depositing a layer of dielectric material. The layer of dielectric material can be a high-K material (including a high-K material that is the same as the material used for the bottom gate dielectric 34) or a standard-K material. The layer of dielectric material used to form the top gate dielectric 38 can be patterned during or immediately after patterning of the top gate electrode 36 as described below, or can be deferred until completion of other subsequent processing steps.

Thereafter, in step 118, the top gate electrode 36 can be formed. Formation of the top gate electrode 36 can include, for example, deposition of a layer of appropriate material and patterning of the deposited layer of material using an appropriate technique (e.g., wet-chemical etching or dry reactive etching). As indicted above, the top gate electrode 36 can be made from the same material or a different material than is used for the bottom gate electrode 32. For example, the top gate electrode 36 can be made from a semiconductor material (e.g., polycrystalline silicon, polycrystalline silicon-germanium, etc.) that is doped with an appropriate dopant. Alternatively, the bottom gate electrode material layer 88 can be formed from a metal or metal-containing. Such a metal or metal-containing compound can be selected for the formation of P-channel devices (e.g., tungsten, nickel, ruthenium, rhodium, palladium, platinum, titanium nitride, tantalum nitride, or the like) or for the formation of N-channel devices (e.g., tungsten, tantalum, aluminum, titanium nitride, tantalum nitride, or the like). A mid-gap material (e.g., a metal (such as tungsten) or metal-containing compound (such as titanium nitride) having a work function near the center of the band-gap (about 4.6 eV)) can also be selected for use in forming both P-channel or N-channel devices.

Next, in step 120, a source extension region 122 and a drain extension region 124 can be formed. The extensions 122, 124 can be formed using a technique such as a lightly doped drain (LDD) technique, as is well known in the art. Briefly, for N-type extensions regions 122, 124, ions such as antimony, phosphorous or arsenic can be implanted. For P-type extension regions 122, 124, ions such as boron, gallium or indium can be implanted. The ions used to form the extensions 122, 124 may diffuse slightly under the top gate 30 as is conventional.

Next, in step 126, the sidewall spacers 44 can be formed using a conventional technique as described above for the formation of the sidewall spacers 42 and from a conventional material, such as a nitride or an oxide. The sidewall spacers 44 and the top gate 30 act as a self-aligned mask for implantation of a source deep doped region 128 and a drain deep doped region 130 in step 132. Implanting dopant species to form the deep doped regions 128, 130 is well known in the art and will not be described in great detail herein. Briefly, for N-type deep doped regions 128, 130, ions such as antimony, phosphorous or arsenic can be implanted. For P-type deep doped regions 128, 120, ions such as boron, gallium or indium can be implanted. Following ion implantation, the wafer 10 can be annealed to activate the dopant species implanted to form the source 20 and the drain 22.

Thereafter, in step 134, any additional processing used to complete formation of the double gate MOSFET 12, and to interconnect various semiconductor devices formed on the wafer 10 (including the MOSFET 12) can be carried out. Step 134 can include formation of the top gate electrode contact 46, the source contact 52, the drain contact 56, the cap layer 50, and the vias 46, 54, 58 and 60.

The method 80 shows a specific order of steps for fabricating the MOSFET 12. However, it is understood that the order may differ from that depicted. For example, the order of two or more steps may be altered relative the order shown. Also, two or more steps may be carried out concurrently or with partial concurrence. In addition, various steps can be omitted and other steps may be added. Furthermore, the method 80 can be modified for the formation of devices other than a MOSFET. It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A double gate MOSFET comprising:
    a bottom gate including a bottom gate electrode and a bottom gate dielectric formed from a high-K material disposed over an upper surface of the bottom gate electrode, the bottom gate electrode defining lateral sidewalls;
    a semiconductor body region disposed over the bottom gate dielectric and the bottom gate electrode, and disposed between a source and a drain, each of the source and the drain having a lightly doped extension and a deep doped region;
    a top gate including a top gate electrode disposed over the body region and a top gate dielectric separating the top gate electrode and the body region, the top gate electrode and the bottom gate electrode defining a channel within the body region and interposed between the extension of the source and the extension of the drain; and
    a sidewall spacer laterally disposed adjacent each lateral sidewall of the bottom gate electrode, the sidewall spacers respectively defining the placement of the deep doped region of the source and the deep doped region of the drain such that the deep doped regions are each disposed laterally adjacent the bottom gate electrode and separated from the bottom gate electrode by at least the respective sidewall spacer.

2. The double gate MOSFET according to claim 1, wherein the high-K bottom gate dielectric is composed of one or more materials selected from hafnium oxide, zirconium oxide, cerium oxide, aluminum oxide, titanium oxide, yttrium oxide, barium strontium titanate and mixtures thereof.

3. The double gate MOSFET according to claim 1, wherein the top gate dielectric is composed of a high-K material.

4. The double gate MOSFET according to claim 3, wherein the high-K top gate dielectric is composed of one or more materials selected from hafnium oxide, zirconium oxide, cerium oxide, aluminum oxide, titanium oxide, yttrium oxide, barium strontium titanate and mixtures thereof.

5. The double gate MOSFET according to claim 1, wherein the bottom gate electrode is formed over an insulating layer and the insulating layer is formed over a semiconductor substrate.

6. The double gate MOSFET according to claim 5, wherein the semiconductor material of the body region is recrystallized amorphous semiconductor material that has been seeded to the semiconductor substrate.

7. The double gate MOSFET according to claim 6, wherein the semiconductor film is silicon.

8. The double gate MOSFET according to claim 1, wherein the body region has a thickness of about 50 Å to about 300 Å.

9. The double gate MOSFET according to claim 1, wherein the bottom gate dielectric is a conformal layer disposed on the sidewall spacers and the upper surface of the bottom gate electrode.

10. The double gate MOSFET according to claim 1, wherein at least a portion of each extension is disposed over the gate electrode and the respective sidewall spacer.

11. A double gate MOSFET comprising:

a bottom gate including a bottom gate electrode and a bottom gate dielectric disposed over an upper surface of the bottom gate electrode, the bottom gate electrode defining lateral sidewalls;

a semiconductor body region disposed over the bottom gate dielectric and the bottom gate electrode, and disposed between a source and a drain, each of the source and the drain having a lightly doped extension and a deep doped region;

a top gate including a top gate electrode disposed over the body region and a top gate dielectric formed from a high-K material and separating the top gate electrode and the body region, the top gate electrode and the bottom gate electrode defining a channel within the body region and interposed between the extension of the source and the extension of the drain; and a sidewall spacer laterally disposed adjacent each lateral sidewall of the bottom gate electrode, the sidewall spacers respectively defining the placement of the deep doped region of the source and the deep doped region of the drain such that the deep doped regions are each disposed laterally adjacent the bottom gate electrode and separated from the bottom gate electrode by at least the respective sidewall spacer.

12. The double gate MOSFET according to claim 11, herein the high-K top gate dielectric is composed of one or more materials selected from hafnium oxide, zirconium oxide, cerium oxide, aluminum oxide, titanium oxide, yttrium oxide, barium strontium titanate and mixtures thereof.

13. The double gate MOSFET according to claim 11, wherein the bottom gate electrode is formed over an insulating layer and the insulating layer is formed over a semiconductor substrate.

14. The double gate MOSFET according to claim 13, wherein the semiconductor material of the body region is recrystallized amorphous semiconductor material that has been seeded to the semiconductor substrate a seed crystal.

15. The double gate MOSFET according to claim 14, wherein the semiconductor film is silicon.

16. The double gate MOSFET according to claim 11, wherein the body region has a thickness of about 50 Å to about 300 Å.

17. The double gate MOSFET according to claim 11, wherein the bottom gate dielectric is a conformal layer disposed on the sidewall spacers and the upper surface of the bottom gate electrode.

18. The double gate MOSFET according to claim 11, wherein at least a portion of each extension is disposed over the gate electrode and the respective sidewall spacer.

* * * * *